United States Patent [19]
Ostrander

[11] Patent Number: 5,104,461
[45] Date of Patent: Apr. 14, 1992

[54] HARDENED INSERT FOR BACKSTOPPING CLUTCH

[75] Inventor: Robert J. Ostrander, Sterling Heights, Mich.

[73] Assignee: Dana Corporation, Toledo, Ohio

[21] Appl. No.: 517,563

[22] Filed: Apr. 30, 1990

[51] Int. Cl.$^5$ .................. C21D 10/00; F16D 69/02
[52] U.S. Cl. ..................... 148/11.5 R; 188/251 A; 428/660; 428/932
[58] Field of Search ................. 188/256, 251 A; 148/11.5 R; 192/12 R, 54; 427/419.7; 428/660, 926, 932, 938

[56] References Cited
U.S. PATENT DOCUMENTS
4,337,300 6/1982 Itaba et al. .................. 428/660

Primary Examiner—R. Dean
Assistant Examiner—Robert R. Koehler
Attorney, Agent, or Firm—MacMillan, Sobanski & Todd

[57] ABSTRACT

An improved hardened insert adapted for use in bi-directional backstopping clutches is disclosed. The inserts are formed from a base material of high speed alloy tool steel, which is relatively inexpensive and easy to machine. The base material is formed into the desired shape for the insert, then hardened and tempered by conventional processes to achieve a desired hardness. Then, a coating of titanium nitride is applied to the insert by a physical vapor deposition process or a chemical vapor deposition process. The titanium nitride coating provides a very hard surface to the insert, which permits the insert to be used in the backstopping clutch.

12 Claims, 1 Drawing Sheet

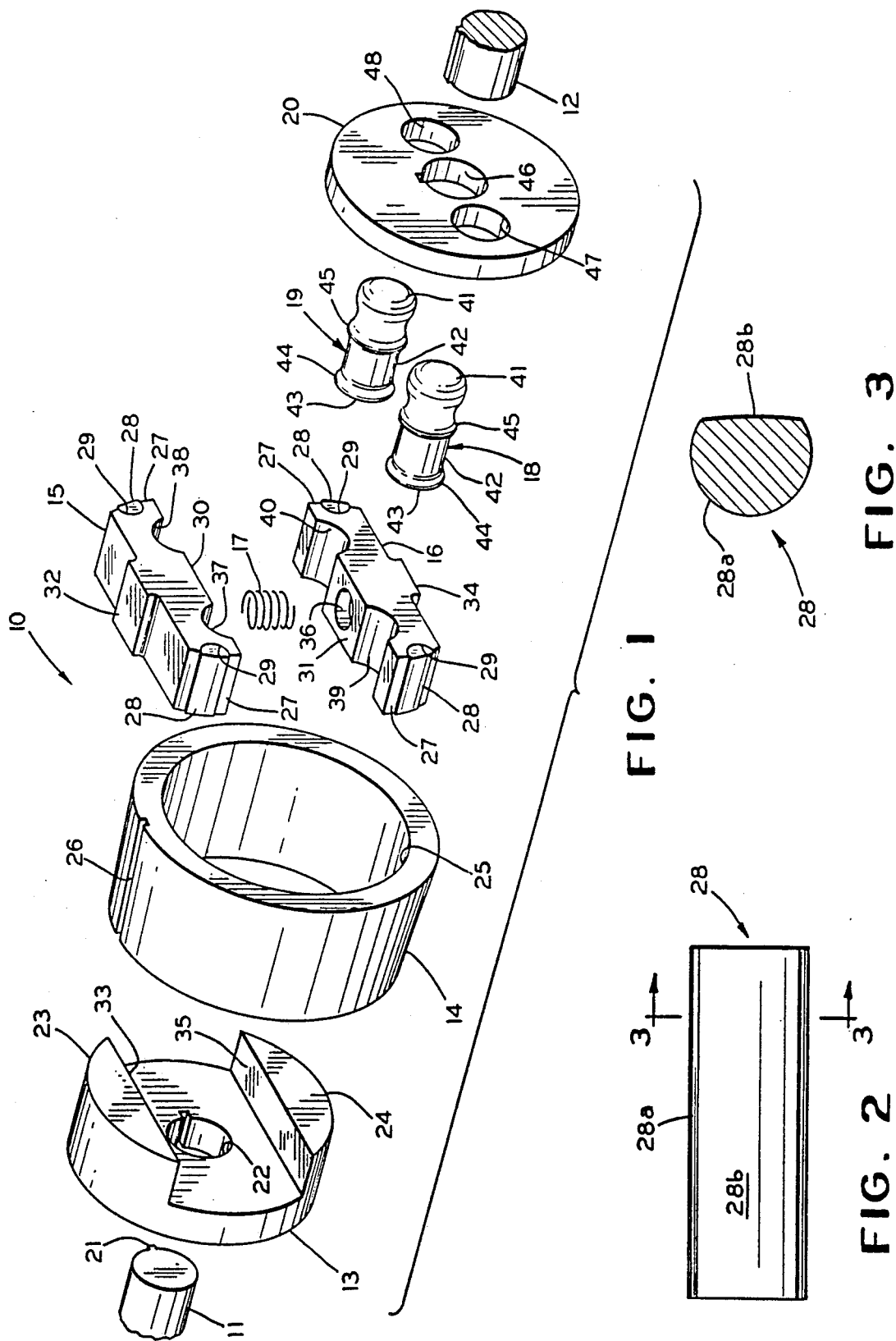

HARDENED INSERT FOR BACKSTOPPING CLUTCH

BACKGROUND OF THE INVENTION

This invention relates in general to bi-directional backstopping clutches and in particular to an improved hardened insert adapted for use in such clutches.

Bi-directional motors are well known devices which are adapted to selectively rotate an output shaft in either a clockwise or counterclockwise direction. Usually, the output shaft is connected to a driven device for rotation therewith, and rotation of the output shaft transmits torque to the driven device. In certain situations, however, the driven device may tend to back drive torque to the motor. In order to prevent this back driving action, a backstopping clutch is usually coupled between the output shaft of the motor and the input shaft of the driven device. A typical bi-directional backstopping clutch includes an input yoke connected to a pair of opposed brake shoes disposed within a hollow cylindrical brake drum. The brake shoes are generally semi-circular in shape, having arcuate braking surfaces which correspond to the inner surface of the brake drum. A pair of drive pins are disposed between the brake shoes, normally in parallel alignment. The drive pins extend into apertures formed in an output member.

Under normal operating conditions, the input yoke rotates the brake shoes, the drive pins, and the output shaft within the brake drum, thereby transmitting torque through to the driven device. However, if the driven device attempts to back drive torque through the clutch, the output member causes the drive pins to become skewed. As a result, the brake shoes are spread apart from one another into locking frictional engagement with the inner surface of the brake drum. In this manner, the clutch prevents back driving of the motor by the driven device. Clutches of this type are also effective in braking in an excessive forward driving situation, wherein too much forward torque is attempted to be transmitted through to the driven device.

The brake shoes are typically provided with hardened wear resistant inserts. The inserts are disposed in respective slots formed in the arcuate outer braking surfaces of the brake shoes. When the brake shoes are moved apart from one another during braking as described above, the inserts frictionally engage the inner surface of the brake drum. The inserts are provided to reduce wear and to reduce repair costs when the braking surfaces have become worn. In the past, these inserts have been formed from solid tungsten carbide. Although inserts formed of this material function satisfactorily, they are quite difficult to manufacture. The extreme hardness of the tungsten carbide material makes them very difficult to grind to proper dimensions. Furthermore, because of the nature of the material itself and the difficulties involved in machining such material, tungsten carbide inserts are quite expensive. At the present time, a single insert manufactured from solid tungsten carbide may cost up to twenty dollars. Accordingly, it would be desirable to provide an insert which is formed from a less expensive material and which is easier to machine than tungsten carbide, yet which functions satisfactorily in bi-directional backstopping clutches.

SUMMARY OF THE INVENTION

This invention relates to an improved hardened insert adapted for use in bi-directional backstopping clutches. The inserts are formed from a base material of high speed alloy tool steel, which is relatively inexpensive and easy to machine. The base material is formed into the desired shape for the insert, then hardened and tempered by conventional processes to achieve a desired hardness. Then, a coating of titanium nitride is applied to the insert by a physical vapor deposition process or a chemical vapor deposition process. The titanium nitride coating provides a very hard surface to the insert, which permits the insert to be used in the backstopping clutch.

It is an object of this invention to provide an improved hardened insert for use in a bi-directional backstopping clutch.

It is another object of this invention to provide such an insert which is much easier to manufacture and which is substantially less expensive in cost than conventional inserts.

Other objects and advantages of this invention will become apparent to those skilled in the art from the following detailed description of the preferred embodiment, when read in light of the accompanying drawings.

BRIEF DESCRIPTION OF THE DRAWINGS

FIG. 1 is an exploded perspective view of a bi-directional backstopping clutch including a plurality of improved hardened inserts in accordance with this invention.

FIG. 2 is a plan view of one of the inserts illustrated in FIG. 1.

FIG. 3 is a sectional elevational view taken along line 3—3 of FIG. 2.

DETAILED DESCRIPTION OF THE PREFERRED EMBODIMENT

Referring now to the drawings, there is illustrated in FIG. 1 a bi-directional backstopping clutch, indicated generally at 10. The basic structure and operation of the clutch 10 is described in detail in co-pending and commonly owned application Ser. No. 07/430,811, the disclosure of which is incorporated herein by reference. The clutch 10 is connected between an input shaft 11 and a output shaft 12. The input shaft 11 has a key 21 formed thereon which cooperates with a complementary shaped opening 22 formed through an input yoke 13. The input yoke 13 includes two spaced axially extending projections 23 and 24. The input yoke 13 is sized such that at least the projections 23 and 24 extend within a central opening 25 formed in a brake drum 14. A key slot 26 or other suitable means is provided on the brake drum 14 for securing it to a support surface (not shown) to prevent rotation.

A pair of brake shoes 15 and 16 are disposed within the brake drum 14. The brake shoes 15 and 16 are formed generally in the shape of semi-circular segments, having arcuate outer surfaces 27. The shoe 15 has an outer flat surface 32 formed thereon which cooperates with a corresponding flat surface 33 formed on the input yoke projection 23. Similarly, the shoe 16 has an outer flat surface 34 formed thereon which cooperates with a corresponding flat surface 35 formed on the input yoke projection 24. The brake shoes 15 and 16 have respective inner flat surfaces 30 and 31 formed thereon which face one another and are slightly spaced apart when the clutch 10 is assembled. A spring 17 is disposed between the two brake shoes 15 and 16 so as to urge them outwardly apart from one another. One end of the spring 17 is located in a recess 36 formed in the center of the inner surface 31, while the other end is located in a similar recess (not shown) formed in the inner surface 30.

Two semi-circular grooves 37 and 38 are formed in the inner surface 30 of the brake shoe 15, while two similar semi-circular grooves 39 and 40 are formed in the inner surface 31 of the brake shoe 16. When the brake shoes 15 and 16 are assembled, the grooves 37 and 39 and the grooves 38 and 40 are respectively aligned to define two cylindrical openings between the shoes 15 and 16. A pair of output pins 18 and 19 are disposed within the openings. Each of the pins 18 and 19 includes a shank 42 having a first end 41 and a second end 43. A first enlarged diameter annular ridge 45 is formed about the shank 42 near the center thereof, while a second enlarged diameter annular ridge 44 is formed about the shank 42 adjacent the second end 43. The annular ridges 44 and 45 sized and spaced apart from one another so as to be disposed within the cylindrical openings defined between the brake shoes 15 and 16 when the clutch 10 is assembled.

An output member 20 is provided with a keyed central opening 46 for connection to the output shaft 12. A pair of openings 47 and 48 are also formed through the output member 20. The openings 47 and 48 are aligned with the output pins 18 and 19 such that the heads 41 thereof are received therein. The cooperation of the output pins 18 and 19 with the output member 20 provides the desired backstopping action for the clutch 10.

The outer surfaces of the brake shoes 15 and 16 are formed having relatively small semi-cylindrical recesses, as shown at 29. Within each of the recesses 29, an insert 28 is disposed. The structure of one of the inserts 28 is illustrated more clearly in FIGS. 2 and 3. As shown therein, the insert 28 is semi-cylindrical in shape, having a curved surface 28a and a slightly curved surface 28b. During use, when the inserts 28 are installed on the brake shoes 15 and 16, they rotate within the recesses 29 so that the slightly curved surfaces 28b frictionally engage the inner surface of the brake drum 14 when the brake shoes 15 and 16 are moved apart during the backstopping action of the clutch 10. This movement insures uniform loading of the engaging surfaces of the inserts 28 and the brake drum 14. As a result, the performance characteristics of the clutch 10, such as input lash, output lash, and efficiency, are less susceptible to deterioration from wear of the contacting surfaces. Also, the inserts 28 are easily replaceable when excessive wear does occur.

The novelty of this invention resides in the composition of the inserts 28. Each insert 28 is formed from a base material of a high speed alloy tool steel, such as M2 steel. This, or a similar material, is used because it has a relatively high annealling temperature, as will be further explained below. For example, the annealling temperature of M2 steel is approximately 1000° F. The base material is initially formed into the desired configuration for the insert 28 by any conventional means. Typically, an elongated strip of material is drawn having the desired cross sectional shape for the inserts 28. The strip is then cut into short lengths to form the inserts 28. Next, the cut inserts 28 are hardened and tempered by any conventional process. As a result of such process, the inserts 28 are preferably hardened to within the range of approximately sixty-two to sixty-five on the Rockwell C scale.

Lastly, the hardened inserts 28 are coated with a thin layer of titanium nitride. The titanium nitride coating may be applied by any conventional process, such as physical vapor deposition or chemical vapor deposition. The thickness of the coating is preferably in the range of from 0.0001 inch to 0.0002 inch on all of the surfaces of the insert 28 so as to provide a surface hardness of approximately eighty-five on the Rockwell C scale. Typically, the titanium nitride coating is applied at an elevated temperature, usually about 450° F. Thus, it is preferable that the annealling temperature of the base material be somewhat higher than this temperature, so as to prevent the base material from being softened during the application of the titanium nitride coating.

The resultant insert 28 is much easier to manufacture and significantly less expensive than the prior inserts formed of solid tungsten carbide discussed above. It is estimated that one insert 28 formed from the titanium nitride coated steel costs approximately four to five dollars, as opposed to the approximate twenty dollar cost for one of the prior solid tungsten carbide inserts. Not only have the titanium nitride coated steel inserts 28 been found to function satisfactorily in clutches 10, two important advantages have been noted. First, the titanium nitride coating appears to have a dry lubricant property which reduces friction (and consequent wear) when the clutch is operating normally, i.e., not in a backstopping mode. Thus, maintenance for the clutch 10 is required less frequently. Second, the use of the softer base material in combination with the titanium nitride coating appears to permit the clutch 10 to rotate at somewhat higher speeds without undesirable chattering. As a result, the clutch 10 may be used in higher speed applications than previously believed acceptable.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

What is claimed is:

1. A method for forming an insert adapted for use between a brake shoe and a brake drum in an overrunning clutch comprising the steps of:
   (a) forming a base material which is softer than tungsten carbide into a desired configuration for the insert;
   (b) hardening the formed base material to a desired hardness; and
   (c) coating the hardened base material with a layer of titanium nitride; and
   (d) installing the insert between a brake shoe and a brake drum in an overrunning clutch.

2. The invention defined in claim 1 wherein said step (a) is performed by drawing an elongated strip of the base material having the desired cross sectional shape for the insert and cutting the elongated strip into shorter pieces.

3. The invention defined in claim 1 wherein said base material is selected to have relatively high annealling temperature.

4. The invention defined in claim 1 wherein said step (c) is performed by a physical vapor deposition process.

5. The invention defined in claim 1 wherein said step (c) is performed by a chemical vapor deposition process.

6. The invention defined in claim 1 wherein the thickness of the coating is in the range of from 0.0001 inch to 0.0002 inch.

7. A method for forming an insert adapted for use between a brake shoe and a brake drum in an overrunning clutch comprising the steps of:
- (a) forming a base material which is softer than tungsten carbide into a desired configuration for the insert;
- (b) hardening the formed base material to within the range of approximately sixty-two to sixty-five on the Rockwell C scale;
- (c) coating the hardened base material with a layer of titanium nitride to provide a surface hardness of approximately eighty-five on the Rockwell C scale; and
- (d) installing the insert between a brake shoe and a brake drum in an overrunning clutch.

8. The invention defined in claim 7 wherein said step (a) is performed by drawing an elongated strip of the base material having the desired cross sectional shape for the insert and cutting the elongated strip into shorter pieces.

9. The invention defined in claim 7 wherein said base material is selected to have relatively high annealling temperature.

10. The invention defined in claim 7 wherein said step (c) is performed by a physical vapor deposition process.

11. The invention defined in claim 7 wherein said step (c) is performed by a chemical vapor deposition process.

12. The invention defined in claim 7 wherein the thickness of the coating is in the range of from 0.0001 inch to 0.0002 inch.

* * * * *